United States Patent
Jo

(10) Patent No.: US 11,031,214 B2
(45) Date of Patent: Jun. 8, 2021

(54) BATCH TYPE SUBSTRATE PROCESSING APPARATUS

(71) Applicant: EUGENE TECHNOLOGY CO., LTD., Yongin-Si (KR)

(72) Inventor: Jeong Hee Jo, Yongin-Si (KR)

(73) Assignee: EUGENE TECHNOLOGY CO., LTD.

(*) Notice: Subject to any disclaimer, the term of this patent is extended or adjusted under 35 U.S.C. 154(b) by 0 days.

(21) Appl. No.: 16/842,737

(22) Filed: Apr. 7, 2020

(65) Prior Publication Data
US 2020/0350145 A1    Nov. 5, 2020

(30) Foreign Application Priority Data

May 2, 2019  (KR) .......................... 10-2019-0051753

(51) Int. Cl.
*H01J 37/32* (2006.01)
*H01L 21/67* (2006.01)

(52) U.S. Cl.
CPC .... *H01J 37/32568* (2013.01); *H01J 37/3244* (2013.01); *H01J 37/32155* (2013.01); *H01J 37/32495* (2013.01); *H01J 37/32559* (2013.01); *H01J 37/32779* (2013.01); *H01L 21/67017* (2013.01); *H01J 2237/3321* (2013.01)

(58) Field of Classification Search
CPC ............ H01J 37/3244; H01J 37/32559; H01J 37/32495; H01J 37/32155; H01J 37/32779; H01J 37/32568; H01J 2237/3321; H01L 21/67017
See application file for complete search history.

(56) References Cited

U.S. PATENT DOCUMENTS

2018/0233351 A1    8/2018  Nakamura et al.

FOREIGN PATENT DOCUMENTS

| JP | 2002280378 A | 9/2002 |
|---|---|---|
| JP | 2004124234 A | 4/2004 |
| JP | 2008300444 A | 12/2008 |
| JP | 2011009699 A | 1/2011 |
| JP | 2016106415 A | 6/2016 |
| JP | 2019057494 A | 4/2019 |
| KR | 100734778 B1 | 7/2007 |
| KR | 20070101067 A | 10/2007 |
| KR | 20090055339 A | 6/2009 |
| KR | 20130045139 A | 5/2013 |
| KR | 20160002538 A | 1/2016 |
| KR | 101931692 B1 | 12/2018 |
| NO | 2018016131 A1 | 1/2018 |
| TW | 201539577 A | 10/2015 |
| WO | 2019035314 A1 | 2/2019 |

*Primary Examiner* — Yuechuan Yu
(74) *Attorney, Agent, or Firm* — Renaissance IP Law Group LLP

(57) ABSTRACT

Provided is a substrate processing apparatus. The substrate processing apparatus includes a tube configured to provide a processing space, a partition wall configured to provide a discharge space in which plasma is generated, a gas supply pipe configured to supply a process gas to the discharge space, and a plurality of electrodes configured to generate plasma in the discharge space. At least one of the plurality of electrodes is disposed outside the partition wall, and at least one of the plurality of electrodes is disposed inside the partition wall.

16 Claims, 8 Drawing Sheets

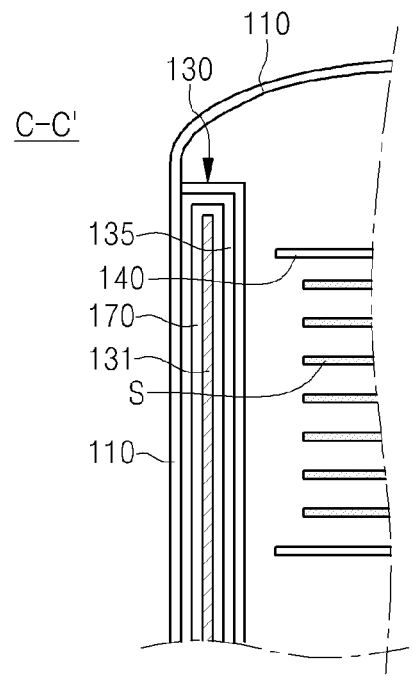
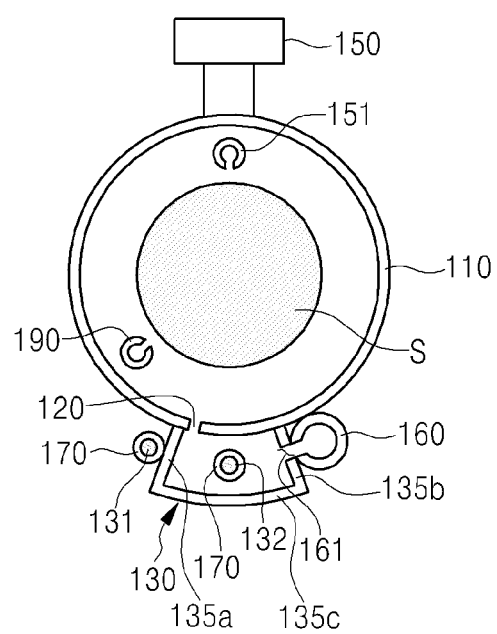

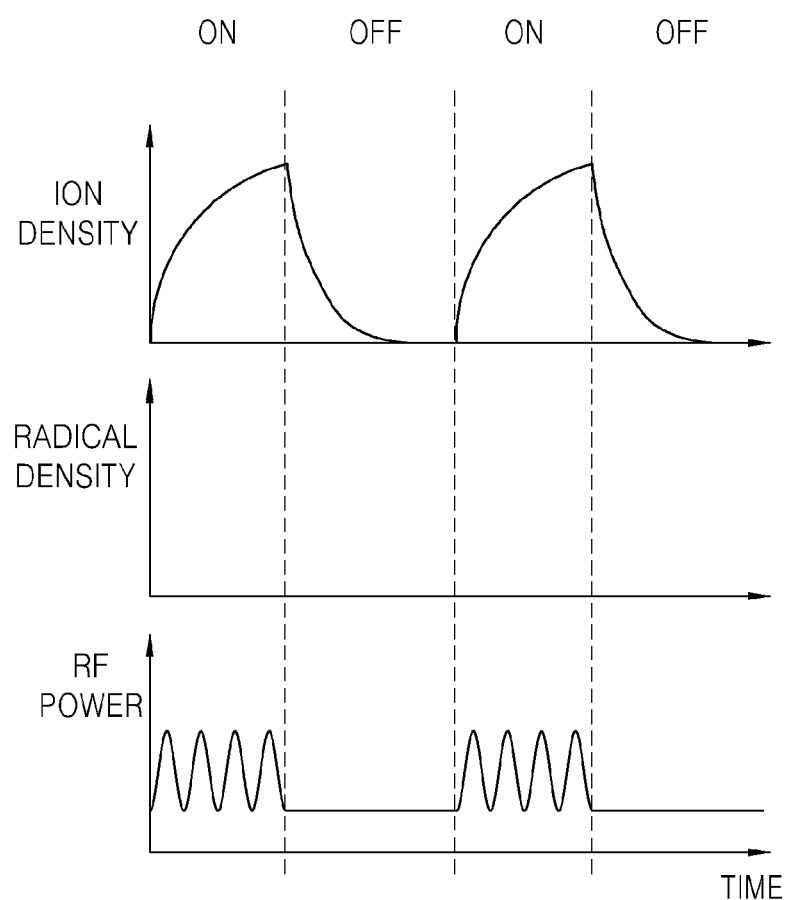

BATCH TYPE SUBSTRATE PROCESSING APPARATUS

CROSS-REFERENCE TO RELATED APPLICATION

This application claims priority to Korean Patent Application No. 10-2019-0051753 filed on May 2, 2019 and all the benefits accruing therefrom under 35 U.S.C. § 119, the contents of which are incorporated by reference in their entirety.

BACKGROUND

The present disclosure relates to a batch type substrate processing apparatus, and more particularly, to a batch type substrate processing apparatus which provides a process gas decomposed in a separate space into a processing space.

In general, substrate processing apparatus that locates a substrate to be processed within a processing space to deposit reaction particles contained in a process gas injected into the processing space by using chemical vapor deposition or atomic layer deposition. The substrate processing apparatus is classified into a single wafer type substrate processing apparatus, which is capable of performing a substrate processing process on one substrate, and a batch type substrate processing apparatus, which is capable of performing a substrate processing process on a plurality of substrates at the same time.

Generally, in the batch type substrate processing apparatus, a wall surface of the processing space as well as the substrate increases in temperature by a hot wall type heating unit surrounding the processing space. As a result, undesired thin films are formed on the inner wall surface of the processing space by the process gases. Here, when a process environment such as plasma is created in the processing space, the thin film deposited on the inner wall are separated as particles by magnetic fields or electric fields generated in the plasm generation space to serve as contaminants during the substrate processing process. As a result, quality of the thin film on the substrate may be deteriorated, and also, efficiency of the substrate processing process may be deteriorated.

SUMMARY

The present disclosure provides a batch type substrate processing apparatus which provides a process gas decomposed in a separate space into a processing space.

In accordance with an exemplary embodiment, a batch type substrate processing apparatus includes: a tube configured to provide a processing space in which a plurality of substrates are accommodated; a partition wall which is separated from the processing space, provides a discharge space in which plasma is generated, and extends in a longitudinal direction of the tube; a gas supply pipe configured to supply a process gas required for processing the plurality of substrates to the discharge space; and a plurality of electrodes extending in the longitudinal direction of the tube and configured to generate plasma in the discharge space, wherein at least one of the plurality of electrodes is disposed outside the partition wall, and at least one of the plurality of electrodes is disposed inside the partition wall.

The plurality of electrodes may include: a first electrode disposed outside the partition wall; and a second electrode disposed inside the partition wall, wherein the first electrode is connected to an RF power source, and the second electrode is grounded.

The first electrode, the second electrode, and the gas supply pipe may be spaced apart from each other in the circumferential direction of the tube, and the gas supply pipe may be disposed outside the partition wall.

The RF power source may supply pulsed RF power having a pulse frequency of approximately 1 kHz to approximately 10 kHz to periodically turn on/off the plasma.

The plurality of electrodes may include a first electrode, a second electrode, and a third electrode, which are spaced apart from each other in the circumferential direction of the tube and sequentially disposed, the first electrode may be disposed outside one side of the partition wall, and the second electrode and the third electrode are disposed inside the partition wall, and the first electrode and the third electrode may be connected to an RF power source, and the second electrode may be grounded.

A distance between the first electrode and the second electrode in the circumferential direction of the tube may be greater than that between the second electrode and the third electrode in the circumferential direction of the tube.

The gas supply pipe may be disposed outside the other side of the partition wall in the circumferential direction of the tube.

The gas supply pipe may include a plurality of gas supply pipes disposed outside the discharge space to supply the process gas to a space between the first electrode and the second electrode and a space between the second electrode and the third electrode.

The batch type substrate processing apparatus may further include a variable power supply unit configured to respectively supply RF power having different intensities to the first electrode and the third electrode.

The RF power source may supply pulsed RF power having a pulse frequency of approximately 1 kHz to approximately 10 kHz to periodically turn on/off the plasma.

The plurality of electrodes may include a first electrode, a second electrode, and a third electrode, which are spaced apart from each other in the circumferential direction of the tube and sequentially disposed, and the first electrode and the third electrode may be disposed outside the partition wall and connected to an RF power source, and the second electrode may be disposed inside the partition wall and grounded.

A distance between the first electrode and the second electrode in the circumferential direction of the tube may be equal to that between the second electrode and the third electrode in the circumferential direction of the tube.

The gas supply pipe may include a plurality of gas supply pipes disposed outside the discharge space to supply the process gas to a space between the first electrode and the second electrode and a space between the second electrode and the third electrode.

The batch type substrate processing apparatus may further include a variable power supply unit configured to respectively supply RF power having different intensities to the first electrode and the third electrode.

The RF power source may supply pulsed RF power having a pulse frequency of approximately 1 kHz to approximately 10 kHz to periodically turn on/off the plasma.

The partition wall may be disposed inside or outside the tube.

BRIEF DESCRIPTION OF THE DRAWINGS

Exemplary embodiments can be understood in more detail from the following description taken in conjunction with the accompanying drawings, in which:

FIG. 2C is a cross-sectional view taken along line C-C' of FIG. 1;

FIG. 3 is a plan view of a substrate processing apparatus in accordance with an exemplary embodiment;

FIG. 11 is a view illustrating an ion density and a radical density depending on application of pulsed RF power in accordance with an embodiment.

DETAILED DESCRIPTION OF EMBODIMENTS

Figure 1:
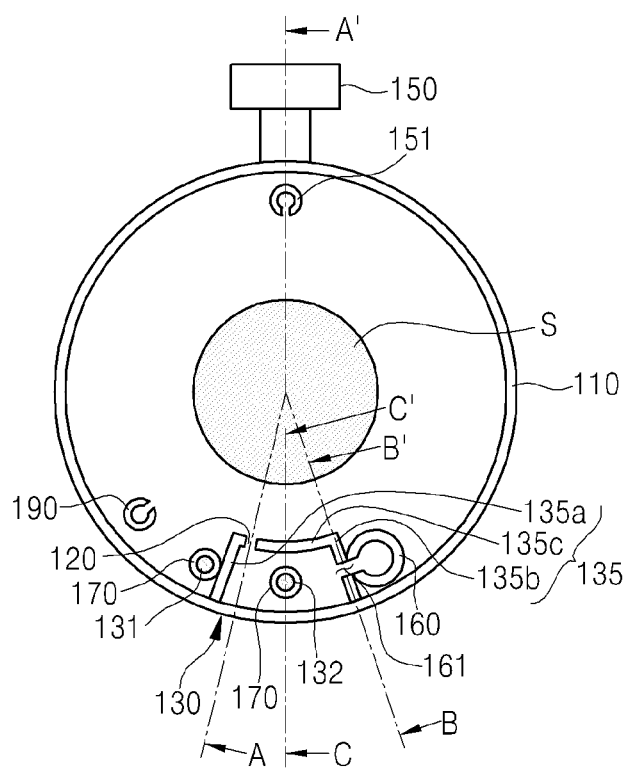
FIG. 1 is a plan view of a substrate processing apparatus in accordance with an exemplary embodiment.

Hereinafter, embodiments will be described in detail with reference to the accompanying drawings. The present inventive concept may, however, be embodied in different forms and should not be construed as limited to the embodiments set forth herein. Rather, these embodiments are provided so that the present inventive concept will be thorough and complete, and will fully convey the scope of the present inventive concept to those skilled in the art. In the figures, the dimensions of layers and regions are exaggerated for clarity of illustration. Like reference numerals refer to like elements throughout.

Figure 2A:
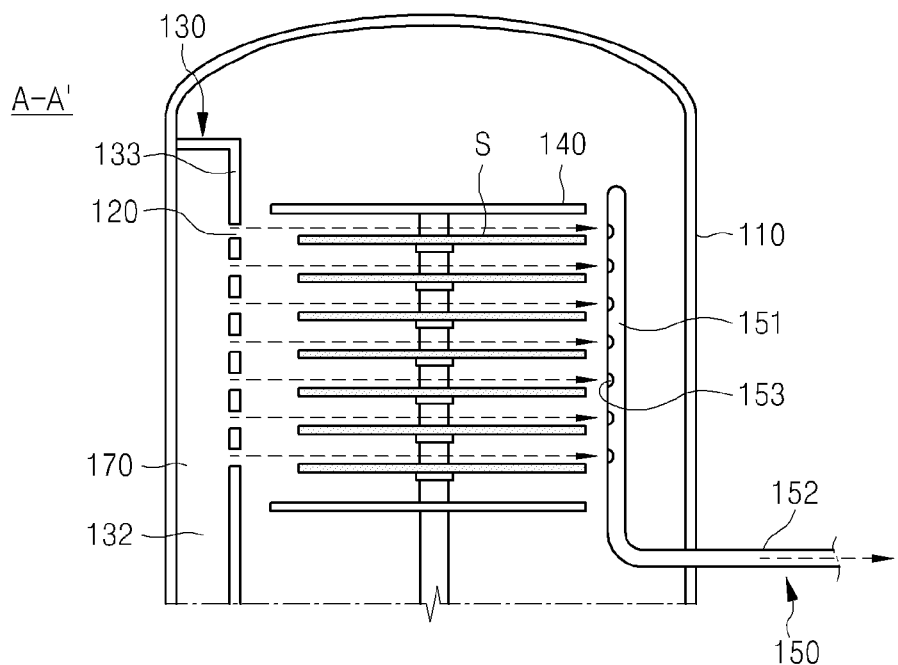
FIG. 2A is a cross-sectional view taken along lien A-A' of FIG. 1.
Figure 2B:
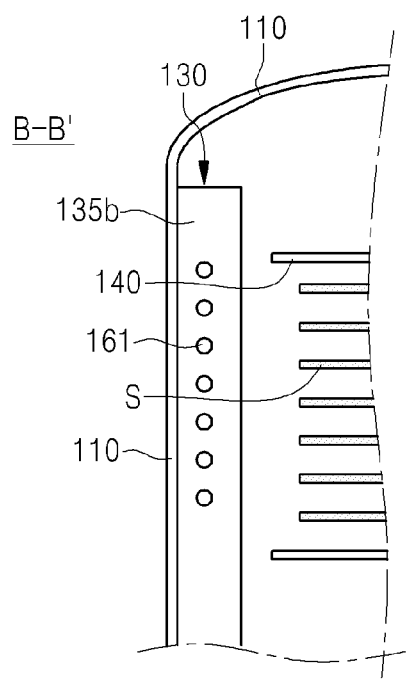
FIG. 2B is a cross-sectional view taken along line B-B' of FIG. 1.

FIG. 1 is a plan view of a substrate processing apparatus in accordance with an exemplary embodiment, FIG. 2A is a cross-sectional view taken along lien A-A' of FIG. 1, FIG. 2B is a cross-sectional view taken along line B-B' of FIG. 1, and FIG. 2C is a cross-sectional view taken along line C-C' of FIG. 1.

Referring to FIGS. 1, 2A, 2B and 2C, a substrate processing apparatus in accordance with an exemplary embodiment includes a tube 110 providing a processing space in which a plurality of substrates S are processed, a substrate support unit 140 which loads the plurality of substrates S in the processing space in a first direction, i.e., a longitudinal direction of the tube 110, an exhaust unit 150 communicating with the tube 110 to exhaust process residues within the processing space to the outside, a partition wall 135 providing a discharge space, which is separated from the processing space, provides a discharge space, in which plasma is generated, and extends in a longitudinal direction of the tube 110, a gas supply pipe 160 supplying a process gas, which is required for a process of processing the plurality of substrates S, to the discharge space, and a plurality of electrodes 131 and 132, which extend in the longitudinal direction of the tube 110 and generate the plasma in the discharge space.

A plasma reaction unit may include the partition wall 130 and the plurality of electrodes 131 and 132. The process gas supplied from the gas supply pipe 160 may be decomposed by the plasma and then be provided into the processing space within the tube 110.

The tube 110 may have a cylindrical shape with a closed upper portion and an opened lower portion and made of a heat resistance material such as ceramic. The tube 110 may provide the processing space in which the plurality of substrates S are accommodated and processed. The processing space of the tube 110 may be a space in which the substrate support unit 140, which loads the plurality of substrates S in a first direction, i.e., in the longitudinal direction of the tube 110, is accommodated, and the processing process (e.g., a deposition process) is actually performed.

The substrate support unit 140 may be configured to support the substrates S so as to load the plurality of substrates S in the first direction, i.e., the longitudinal direction of the tube 110 and provide a plurality of unit processing spaces in which the plurality of substrates S are individually processed. That is, the substrate support unit 140 may provide a plurality of layers so that the substrates S are loaded in the first direction, i.e., in the longitudinal direction of the tube 110. Here, one substrate S may be loaded on one layer (or a unit processing space). Thus, the unit processing space for each substrate S may be individually defined on each layer of the substrate support unit 140 to prevent the unit processing spaces from interfering with each other.

The substrate support unit 140 is not particularly limited in form or structure as long as the substrate support unit 140 moves into the processing space within the tube 110 through a lower portion (or an entrance) of the tube 110 When all of the plurality of substrates S are loaded on the substrate support unit 140.

The gas supply pipe 160 may be configured so that the process gas required for the process of processing the plurality of substrates S may be supplied into the tube 110 through the plasma reaction unit 130.

The plasma reaction unit 130 may be separated from the processing space by the partition wall 135 that provides the discharge space in which the plasma is generated inside the tube 110. The plasma reaction unit 130 may be component that decomposes the process gas supplied from the gas supply pipe 160 by using the plasma and provides only radicals of the decomposed process gas into the processing space.

The partition wall 135 may include sub sidewalls 135a and 135b, which are disposed inside the tube 110 and connected to an inner wall of the tube 110, and a main sidewall 135c between the sub sidewalls 135a and 135b. The partition wall 135 may include the sub sidewalls 135a and 135b extending to the inside of the tube 110 from the inner wall of the tube 110 and spaced apart from each other and the main sidewalls 135c disposed between the sub sidewalls 135a and 135b and spaced apart from the inner wall of the tube 110. The sub sidewalls 135a and 135b and the main sidewall 135c may extend in the longitudinal direction of the tube 110 along the inner wall of the tube 110. However, the partition wall 135 is not limited to the shape illustrated in FIG. 1 as long as the partition wall 135 provides the discharge space that is separated from the processing process. In an exemplary embodiment, the main sidewall 135c may further extend in the circumferential direction of the tube 110 over the sub sidewalls 135a and 135b to form a tube shape having a diameter less than that of the tube 110.

The plurality of electrodes 131 and 132 may be spaced apart from each other in the circumferential direction of the tube 110. The plurality of electrodes 131 and 132 include a first electrode 131 disposed outside one side of the partition wall 135 and a second electrode 132 disposed inside the partition wall 135. The first electrode 131 may be connected to an RF power source, and the second electrode 132 may be grounded. The first electrode 131 may be referred to as a power electrode, and the second electrode 132 may be referred to as a ground electrode. The first electrode 131 may be disposed adjacent to an outer wall of the first sub sidewall 135a, and the second electrode 132 may be disposed adjacent to an inner wall of the second sub sidewall 135b. The first electrode 131 and the second electrode 132 may extend in the first direction in which the plurality of substrates S are loaded, i.e., in the longitudinal direction of the tube 110. Here, the first electrode 131 and the second electrode 132 may be disposed to be spaced apart from each other. Also, the RF power may be applied to the first electrode 131 to generate capacitive coupled plasma (CCP) by electric fields generated between the first electrode 131 and the second electrode 132.

As the RF power applied to stably generate the plasma or obtain a desired amount of radicals increases, the protective pipe 170, which protects the electrodes 131 and 132, and the partition wall 135 may be damaged by ions having high energy, and thus, particles may be generated. Particularly, as the RF power is applied, the ions having the high energy may be accelerated toward the first electrode 131 to repeatedly collide with the protective pipe 170, thereby further damaging the protective pipe 170 that protects the first electrode 131 to which the RF power is applied. When the protective pipe 170 is damaged, the internal electrode 132 may also be damaged or contaminated.

In an exemplary embodiment, the first electrode 131, to which the RF power is applied to generate the plasma in the discharge space, may be disposed outside the partition wall 135 to prevent the first electrode 131 and the protective pipe 170 from being damaged by the plasma. Also, when the first electrode 131 is disposed outside the partition wall 135, the partition wall 135 having high dielectric constant compared to the process gas may be disposed between the first electrode 131 and the second electrode 132 to reduce an impedance of the first electrode 131 due to an increase in capacitance component when compared to a case in which the first electrode is disposed inside the partition wall 135. Thus, the RF power applied to stably generate the plasma or obtain the desired amount of radicals may be reduced. Therefore, the intensity of the electric fields between the first electrode 131 and the second electrode 132 may be reduced to reduce the damage of the partition wall 135 due to the plasma.

Also, the RF power source may supply pulsed RF power to the first electrode 131. The pulsed RF power may be adjusted in pulse width and duty ratio in a pulse frequency range of approximately 1 kHz to approximately 10 kHz. When the pulsed RF power is applied to the first electrode 131, the plasma may be periodically turned on/off, i.e., the plasma may be generated in the form of a pulse. Thus, the density of the ions that damage the partition wall and generate the particles during the processing process may be reduced, whereas the density of the radicals may be constantly maintained (see FIG. 11). In accordance with the exemplary embodiment, the partition wall 135 may be prevented from being damaged by the plasma while maintaining the efficiency of the processing process. In general, the RF power may have a frequency of approximately 0.1 MHz to several hundred MHz.

The first electrode 131, the second electrode 132, and the gas supply pipe 160 may be spaced apart from each other in the circumferential direction of the tube 110, and the second electrode 132 may be disposed between the first electrode 131 and the gas supply pipe 160. The gas supply pipe 160 may be disposed outside the other side of the partition wall 135, i.e., disposed outside the second sub sidewall 135b of the partition wall 135 to supply the process gas to the discharge space within the partition wall 135. The gas supply pipe 160 may have a plurality of supply holes 161 arranged in the first direction, i.e., in the longitudinal direction of the tube 110.

When the gas supply pipe 160 is disposed inside the partition wall 135, a dead zone in which the plasma is not generated may be defined in a space around the gas supply pipe 160. Also, when the plurality of supply holes of the gas supply pipe 160 disposed inside the partition wall 135 are disposed toward the partition wall 135, an eddy may be generated inside the partition wall 135, and thus, it takes a time to generate a uniform pressure to the discharge space inside the partition wall 135. In an exemplary embodiment, since the gas supply pipe 160 is disposed outside the second sub sidewall 135b to directly supply the process gas to the discharge space inside the partition wall 135, the eddy may not be generated inside the partition wall 135, and also, the uniform pressure may be generated in the discharge space within a short time. Also, in an exemplary embodiment, since the first electrode 131 and the gas supply pipe 160 are disposed outside the partition wall 135, the discharge space may be reduced in size to generate the uniform pressure in the discharge space within the short time.

A plurality of injection holes 120 through which the radicals of the process gas decomposed in the plasma reaction unit 130 are injected into the processing space may be defined in the plasma reaction unit 130. The plurality of injection holes 120 may be defined in the main sidewall 135c of the partition wall 135. The plurality of injection holes 120 may be defined in a side that is far from the gas supply pipe 160 and also be provided in positions corresponding between the first electrode 131 and the second electrode 132. Thus, the process gas supplied from the gas supply pipe 160 may be sufficiently decomposed by the plasma generated between the first electrode 131 and the second electrode 132, and thus, the radicals having the high density may be supplied to the processing space. The plurality of injection holes 20 may be arranged in the first direction, i.e., in the longitudinal direction of the tube 110 to correspond to the unit processing spaces of the substrate support unit 140 so that the radicals are supplied to the plurality of substrates S, respectively.

When the process gas is directly supplied to the processing space within the tube 110 to generate the plasma in the processing space, a thin film formed on the inner wall of the tube 110 may be separated as particles while the processing process is performed by magnetic fields or electric fields for generating the plasma. In an exemplary embodiment, the separator plasma reaction unit 130 may be provided in the tube 110, i.e., the discharge space in which the plasma is generated and the processing space in which the substrates S are processed may be separated from each other to prevent the thin film formed on the inner wall of the tube 110 from being separated as the particles while the processing process is performed.

The exhaust unit 150 may be disposed to face the plasma reaction unit 130. The exhaust unit 150 may be disposed in the processing space to exhaust process residues within the processing space to the outside. The exhaust unit 150 may be constituted by an exhaust member 151 extending in the first direction, i.e., in the longitudinal direction of the tube 110 and an exhaust line and exhaust pump (not shown), which are connected to the exhaust member 151. The exhaust member 151 may be provided with a plurality of exhaust holes 153 facing the injection holes of the plasma reaction unit 130 and arranged in the first direction, i.e., in a vertical direction to correspond to the unit processing spaces of the substrate support unit 140, respectively.

As described above, since the injection holes 120 of the plasma reaction unit 130 and the exhaust holes 153 of the exhaust unit 150 correspond to each other to be disposed in the same line in a second direction (for example, a direction parallel to surfaces of the substrates S) crossing the first direction in which the substrates S are loaded, the radicals injected from the injection holes 120 may laminar-flow while being introduced into the exhaust holes 153. Thus, the radicals injected from the injection holes 120 may be uniformly supplied to top surfaces of the substrates S.

The substrate processing apparatus in an exemplary embodiment may further include the protective pipe 170 surrounding the first electrode 131 and the second electrode 132.

Each of the first electrode 131 and the second electrode 132 may be protected in a state of being surrounded by the protective pipe 170 from an upper portion to a lower portion thereof. Each of the first electrode 131 and the second electrode 132 may be provided as braided wire having flexibility.

In general, a skin effect in which current flows along a surface thereof may occur in electrical conduction due to the use of the RF frequency. Here, when a net-type mesh electrode is used, since an area occupied by the empty space is wide, the RF power is inefficiently applied by large resistance due to a small surface area. Furthermore, the substrate processing process is repeatedly performed at high and low temperatures. When the net-type mesh electrode is used, the mesh electrode may be irregularly changed in shape in accordance with a temperature change and thus be disadvantageous in terms of shape retention. In addition, since resistance is changed in accordance with the changed shape, when the RF power is applied, non-uniform plasma may be generated.

In order to prevent the above-mentioned limitations, each of the first electrode 131 and the second electrode 132 in accordance with an exemplary embodiment may be inserted into the protective pipe 170 and also be provided in the braided type (braided wire) having flexibility. In an exemplary embodiment, in order to further reduce the empty space, a method of applying a metal on the surface of each of the electrodes may be additionally performed.

The protective pipe 170 may surround the outside of each of the first electrode 131 and the second electrode 132 to electrically insulate the first and second electrodes 131 and 132 and also may protect the electrodes, which are exposed to the plasma atmosphere, from the plasma. Thus, the electrodes may be safely protected from the contaminants or particles, which may be generated by the plasma. The protective pipe 170 may be made of a heat-resistant material such as quartz or ceramic.

The substrate processing apparatus according to an exemplary embodiment may further include a source gas supply pipe 190 that supplies a source gas to the processing space in the tube 110. The source gas supply pipe 190 is disposed in the tube 110 and may be disposed at one side of the plasma reaction unit 130.

The process gas may include one or more kinds of gases, that is, a source gas and a reaction gas that reacts with the source gas to generate a thin film material. The source gas supply pipe 190 may directly supply the source gas to the processing space. Unlike the source gas supply pipe 190 that directly supplies the source gas to the processing space, the gas supply pipe 160 may supply the reaction gas first into the plasma reaction unit 130, and the reaction gas may be activated by the plasma and then supplied to the processing space. For example, when the thin film material to be deposited on the substrates S is silicon nitride, the source gas may include a silicon-containing gas, dichlorosilane ($SiH_2Cl_2$, abbreviation: DCS), and the like, and the reaction gas may include a nitrogen-containing gas, $NH_3$, $N_2O$, NO, and the like.

In an exemplary embodiment, since the reaction gas having a relatively higher gas decomposition temperature than the source gas is supplied to the plasma reaction unit 130, the reaction gas may be effectively decomposed by the plasma reaction unit 130 and be supplied to the processing space.

The substrate processing apparatus may further include a heating unit surrounding the tube 110 to heat the plurality of substrates S. Also, the substrate support unit 140 may rotate by a rotation unit to be connected to a lower portion of the substrate support unit 140 so as to uniformly perform the processing process.

FIG. 3 is a plan view of a substrate processing apparatus in accordance with an exemplary embodiment.

Referring to FIG. 3, a plasma reaction unit 130 in accordance with an exemplary embodiment may be provided outside a tube 110. A configuration and effect of the plasma reaction unit 130 are the same or similar to those described with reference to FIGS. 1 and 2.

A partition wall 135 may include first and second sub sidewalls 135a and 135b, which are disposed outside the tube 110 and connected to the outer wall of the tub 110, and a main sidewall 135c disposed between the first and second sub sidewalls 135a and 135b. The partition wall 135 may include the sub sidewalls 135a and 135b extending to the outside of the tube 110 from the outer wall of the tube 110 and spaced apart from each other and the main sidewalls 135c disposed between the sub sidewalls 135a and 135b and spaced apart from the outer wall of the tube 110.

A first electrode 131 may be disposed adjacent to the first sub sidewall 135a, and a gas supply pipe 160 may be disposed outside the second sub sidewall 135b to supply a process gas to a discharge space inside the partition wall 135 through a plurality of supply holes 161. The tube 110 may include a plurality of injection holes 120 in positions corresponding between a first electrode 131 and a second electrode 132.

In an exemplary embodiment, the plasma reaction unit 130 may be disposed outside the tube 110 to reduce a diameter of the tube 110. Thus, since the tube 110 may limit a unit processing space in which each of substrates S is processed, process gases decomposed in the plasma reaction unit 130, i.e., radicals may ideally laminar-flow into the unit processing spaces. That is to say, since the plasma reaction unit 130 is disposed outside the tube 110, the tube 110 may limit the unit processing spaces in which the plurality of substrates S are loaded. In addition, since the unit processing spaces for the substrate S, which are respectively loaded on layers, are limited by an inner wall surface of the processing space so as to be separated from each other, the radicals injected from the injection holes 120, which respectively correspond to the unit processing spaces, may be not wasted and uniformly supplied onto top surfaces of the substrates S so as to be laminar-flow.

Figure 4:
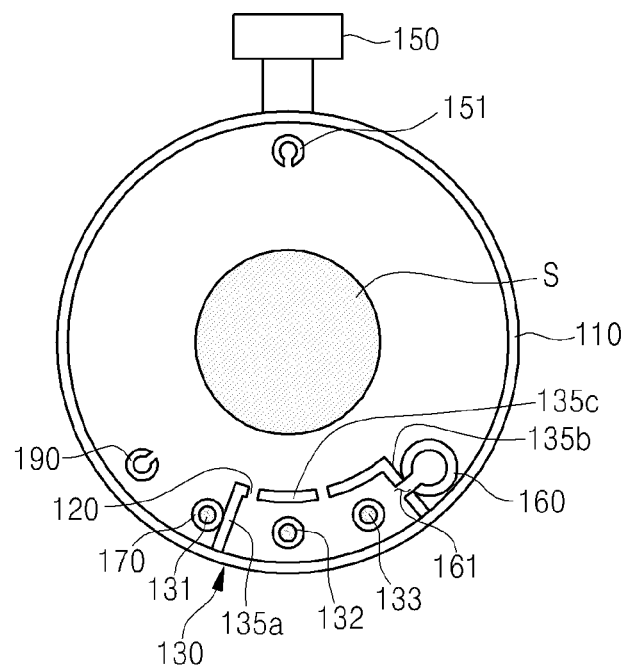
FIG. 4 is a plan view of a substrate processing apparatus in accordance with an exemplary embodiment.

FIG. 4 is a plan view of a substrate processing apparatus in accordance with an exemplary embodiment.

Referring to FIG. 4, the substrate processing apparatus in accordance with an exemplary embodiment includes a tube 110 providing a processing space in which a plurality of substrates S are processed, a substrate support unit 140 which loads the plurality of substrates S in the processing space in a first direction, i.e., a vertical direction of the tube 110, an exhaust unit 150 communicating with the tube 110 to exhaust process residues within the processing space to the outside, a partition wall 135 extending from the tube 110 to define a discharge space which is separated from the processing space and in which plasma is generated, a gas supply pipe 160 supplying a gas, which is required for a process of processing the plurality of substrates S, to the inside of the partition wall 135, and a plurality of electrodes configured to generate the plasma in the discharge space defined by the partition wall 135.

The partition wall 135 may include sub sidewalls 135*a* and 135*b*, which are disposed inside the tube 110 and connected to an inner wall of the tube 110 and a main sidewall 135*c* between the sub sidewalls 135*a* and 135*b*. The partition wall 135 may include the sub sidewalls 135*a* and 135*b* extending to the inside of the tube 110 from the inner wall of the tube 110 and spaced apart from each other and the main sidewalls 135*c* disposed between the sub sidewalls 135*a* and 135*b* and spaced apart from the inner wall of the tube 110. The sub sidewalls 135*a* and 135*b* and the main sidewall 135*c* may extend in the longitudinal direction of the tube 110 along the inner wall of the tube 110. In an exemplary embodiment, the main sidewall 135*c* may further extend in the circumferential direction of the tube 110 over the sub sidewalls 135*a* and 135*b* to form a tube shape having a diameter less than that of the tube 110.

The plurality of electrodes 131, 132, and 133 include a first electrode 131 disposed outside the partition wall 135, and second and third electrodes 132 and 133 disposed inside the partition wall 135.

The first and third electrodes 131 and 133 may be connected to an RF power source, and the second electrode 132 may be grounded. Each of the first and third electrodes 131 and 133 may be referred to as a power electrode, and the second electrode 132 may be referred to as a ground electrode.

The first electrode 131, the second electrode 132, and the third electrode 133 may be spaced apart from each other in a circumferential direction of the tube 110 and sequentially disposed. Here, the first electrode 131 may be disposed outside one side of the partition wall 135, and the second and third electrodes 133 may be disposed inside of the partition wall 135, i.e., in the discharge space. The first electrode 131 may be disposed adjacent to an outer wall of the first sub sidewall 135*a* of the partition wall 135, and the second electrode 132 may be disposed adjacent to an inner wall of the second sub sidewall 135*b* of the partition wall 135. The second electrode 132 may be disposed between the first electrode 131 and the third electrode 133. The first electrode 131, the second electrode 132, and the third electrode 133 may extend in the first direction in which the plurality of substrates S are loaded, i.e., in the longitudinal direction of the tube 110. Here, since RF power is applied to each of the first electrode 131 and the third electrode 133, capacitive coupled plasma (CCP) may be generated by electric fields generated between the first and second electrodes 131 and 132 and between the second and third electrodes 132 and 133.

In order to activate the process gas by using the plasma, in general, the RF power may be applied to one electrode in a two-electrode structure to generate the plasma. In this case, power for stably generating the plasma or power for obtaining a desired amount of radicals may increase to generate particles. That is, when the RF power is applied to one electrode, high power may be applied to obtain the desired amount of radicals, and thus, ionized particles may have high energy. Thus, the protective pipe 170, which protects the electrodes, and the partition wall 135 may be damaged by the particles, and thus, the particles may be generated.

In an exemplary embodiment, the RF power may be individually supplied to two electrodes by using three-electrode structure in which the second electrode 132 is grounded between the first electrode 131 and the third electrode 133 to which the RF power is respectively applied. Thus, the power required for generating the plasma and the power for obtaining a desired amount of radicals may decrease to reduce an amount of particles to be generated or prevent the particles from being generated when compared to the case in which the high RF power is applied to one electrode.

Since the first electrode 131 is disposed outside the partition wall 135, and the third electrode 133 is disposed inside the partition wall 135, the partition wall 135 having a dielectric constant greater than that of the process gas may be disposed between the first electrode 131 and the second electrode 132, and thus, an impedance of the first electrode 131 and an impedance of the third electrode 133 may be different from each other. For example, the impedance of the first electrode 131 may be less than that of the third electrode 133. In this case, a distance between the first electrode 131 and the second electrode 132 and a distance between the second electrode 132 and the third electrode 133 may be adjusted to match the impedances. For example, in order to match the impedances, the distance between the first electrode 131 and the second electrode 132 in a circumferential direction of the tube 110 may be adjusted to be greater than that between the second electrode 132 and the third electrode 133. Thus, the RF power may be equally applied to the first electrode 131 and the third electrode 133 to uniformly generate the plasma in the space between the first electrode 131 and the second electrode 132 and the space between the second electrode 132 and the third electrode 133. In this case, the distance between the first electrode 131 and the second electrode 132 may increase or decrease to reduce an intensity of electric fields between the first electrode 131 and the second electrode 132, thereby reducing damage of the partition wall disposed around the first electrode 131 or preventing the partition wall from being damaged.

The RF power having different intensities may be respectively applied to the first electrode 131 and the third electrode 133 in a variable power supply unit 180 instead of adjusting the distance between the electrodes, for example, the lower RF power may be applied to the first electrode 131 having the relatively small impedance to uniformly generate the plasma in the space between the first and second electrodes 131 and 132 and the space between the second and third electrodes 132 and 133. In this case, the lower RF power may be applied to the first electrode 131 to reduce the damage of the partition wall 135 disposed around the first electrode 131 or prevent the partition wall 135 from being damaged. The variable power supply unit 180 for respectively applying the RF power having different intensities to the first electrode 131 and the third electrode 133 will be described later in detail.

In an exemplary embodiment, the pulsed RF power may be supplied to the first electrode 131 and the third electrode 133. The pulsed RF power may be adjusted in pulse width and duty ratio in a pulse frequency band of approximately 1 kHz to approximately 10 kHz. The duty ratio means a ratio of an on-cycle and an off-cycle. When the pulsed RF power is applied to the first electrode 131 and the third electrode 133, the plasma may be periodically turned on/off, i.e., the plasma may be generated in the form of a pulse. Thus, the density of the ions that damage the electrode and the partition wall and generate the particles during the processing process may be reduced, whereas the density of the radicals may be constantly maintained (see FIG. 11). Thus, while maintaining efficiency of the processing process, the damage of the third electrode 133 and the partition wall 135 due to the plasma may be reduced or prevented from occurring.

The gas supply pipe 160 may be disposed outside the other side of the partition wall 135 in the circumferential direction of the tube 110. The gas supply pipe 160 may be disposed outside the second sub sidewall 135b of the partition wall 135 so as to be spaced apart from the third electrode 133 in the circumferential direction of the tube 110, thereby supplying the process gas to the discharge space inside the partition wall 135 through the plurality of supply holes 161. The gas supply pipe 160 may have a plurality of supply holes 161 arranged in the first direction, i.e., in the longitudinal direction of the tube 110.

When the gas supply pipe 160 is disposed inside the partition wall 135, a dead zone in which the plasma is not generated may be defined in a space around the gas supply pipe 160. Also, when the plurality of supply holes of the gas supply pipe 160 disposed inside the partition wall 135 are disposed toward the partition wall 135, an eddy may be generated inside the partition wall 135, and thus, it takes a time to generate a uniform pressure to the discharge space inside the partition wall 135. In an exemplary embodiment, since the gas supply pipe 160 is disposed outside the second sub sidewall 135b to directly supply the process gas to the discharge space inside the partition wall 135, the eddy may not be generated inside the partition wall 135, and also, the uniform pressure may be generated in the discharge space within a short time. Also, in an exemplary embodiment, since the first electrode 131 and the gas supply pipe 160 are disposed outside the partition wall 135, a time taken to uniformly diffuse the process gas may be reduced. That is, a uniform pressure may be generated in the discharge space within a short time. Thus, the process gas may be decomposed by the plasma to reduce a time taken to supply the process gas to the processing space.

A plurality of injection holes 120 through which the radicals of the process gas decomposed in the plasma reaction unit 130 are injected into the processing space may be defined in the plasma reaction unit 130. The plurality of injection holes 120 may be defined in the main sidewall 135c of the partition wall 135. The main sidewall 135c may include a plurality of injection holes 120 in positions corresponding between the first electrode 131 and the second electrode 132 and between the second electrode 132 and the third electrode 133. Thus, the process gas supplied from the gas supply pipe 160 may be sufficiently decomposed by the plasma generated between the first electrode 131 and the second electrode 132 and between the second electrode 132 and the third electrode 133, and thus, the radicals having the high density may be supplied to the processing space.

Figure 5:
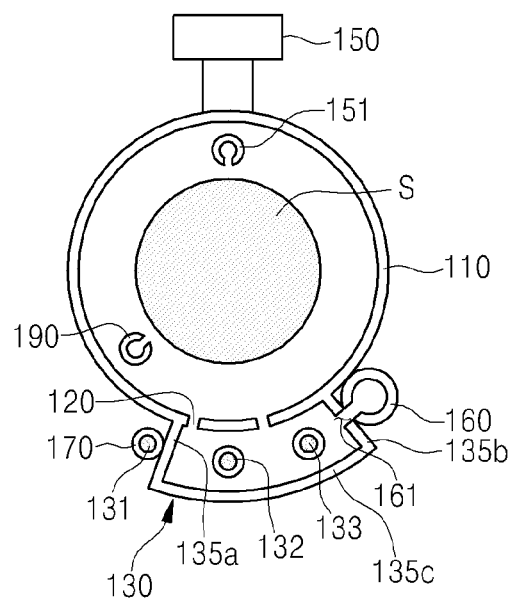
FIG. 5 is a plan view of a substrate processing apparatus in accordance with an embodiment.

FIG. 5 is a plan view of a substrate processing apparatus in accordance with an exemplary embodiment.

Referring to FIG. 5, a plasma reaction unit 130 in accordance with an exemplary embodiment may be provided outside the tube 110. A configuration and effect of the plasma reaction unit 130 are the same or similar to those described with reference to FIG. 4.

A partition wall 135 may include first and second sub sidewalls 135a and 135b, which are disposed outside the tube 110 and connected to the outer wall of the tub 110, and a main sidewall 135c disposed between the first and second sub sidewalls 135a and 135b. The partition wall 135 may include the sub sidewalls 135a and 135b extending to the outside of the tube 110 from the outer wall of the tube 110 and spaced apart from each other and the main sidewalls 135c disposed between the sub sidewalls 135a and 135b and spaced apart from the outer wall of the tube 110.

A first electrode 131 may be disposed adjacent to an outer wall of the first sub sidewall 135a, and a second electrode 132 may be disposed adjacent to an inner wall of the second sub sidewall 135b. The second electrode 132 may be disposed between the first electrode 131 and the third electrode 133.

A gas supply pipe 160 may be disposed outside the second sub sidewall 135b to supply a process gas to a discharge space inside the partition wall 135 through a plurality of supply holes 161.

The tube 110 may include a plurality of injection holes 120 in positions corresponding between a first electrode 131 and a second electrode 132.

In an exemplary embodiment, since the plasma reaction unit 130 is disposed outside the tube 110, the tube 110 may limit unit processing spaces in which a plurality of substrates S are loaded. In addition, since the unit processing spaces for the substrate S, which are respectively loaded on layers, are limited by an inner wall surface of the processing space so as to be separated from each other, the radicals injected from the injection holes 120, which respectively correspond to the unit processing spaces, may be not wasted and uniformly supplied onto top surfaces of the substrates S so as to be laminar-flow.

Figure 6:
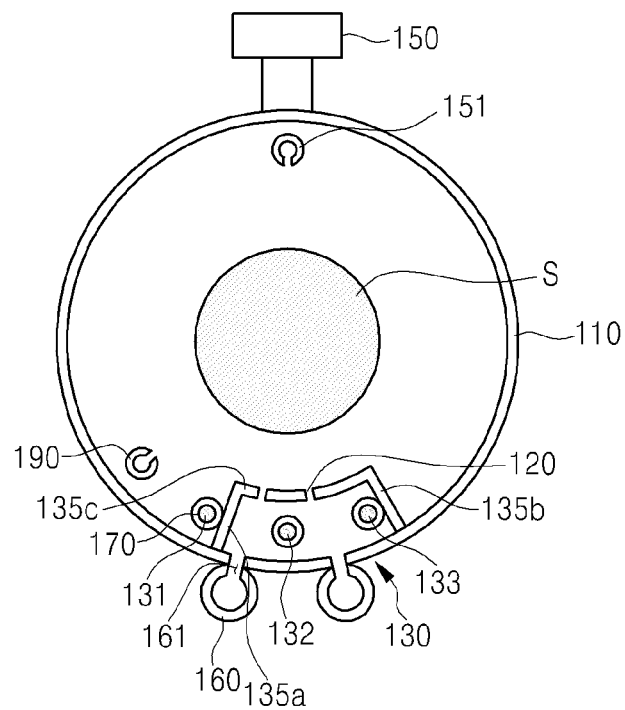
FIG. 6 is a plan view of a substrate processing apparatus in accordance with an embodiment.

FIG. 6 is a plan view of a substrate processing apparatus in accordance with an exemplary embodiment.

The substrate processing apparatus according to an embodiment of the present inventive concept is the same as or similar to the substrate processing apparatus of FIG. 4 except for a plasma reaction unit 130 and a gas supply pipe 160, and thus, following description will mainly focus on differences.

The plasma reaction unit 130 includes a first electrode 131 disposed outside a partition wall 135 and second and third electrodes 132 and 133 disposed inside the partition wall 135. The first and third electrodes 131 and 133 may be connected to an RF power source, and the second electrode 132 may be grounded. The first electrode 131 may be disposed adjacent to an outer wall of a first sub sidewall 135a of the partition wall 135, and the second electrode 132 may be disposed adjacent to an inner wall of a second sub sidewall 135b of the partition wall 135. The second electrode 132 may be disposed between the first electrode 131 and the third electrode 133. Since a gas supply pipe 160 is not disposed outside the second sub sidewall portion 135b, a space for supplying a process gas may not be required. The second electrode 132 may be disposed further adjacent to the inner wall of the second sub sidewall 135b when compared to the structure illustrated in FIG. 4.

The plurality of gas supply pipes 160 may be disposed outside the tube 110, i.e., outside the discharge space, i.e., disposed outward from a line connecting the first to third electrodes 131, 132, and 133 to each other, and supply holes 161 of the plurality of gas supply pipes 160 may be defined toward a space between the first electrode 131 and the second electrode 132 and a space between the second electrode 132 and the third electrode 133.

When the supply holes 161 of the plurality of gas supply pipes 160 are defined toward a space between the first electrode 131 and the second electrode 132 and a space between the second electrode 132 and the third electrode 133, the process gas supplied through the supply holes 161 of the plurality of gas supply pipes 160 may be directly supplied into discharge spaces between the first electrode 131 and the second electrode 132 and between the second electrode 132 and the third electrode 133. Thus, an eddy may not be generated inside the partition wall 135, and a time taken to diffuse the process gas into the discharge space may be reduced to improve a decomposition rate of the process gas and a plasma decomposition rate.

Also, the plurality of gas supply pipes 160 may be disposed outside the tube 110 to reduce a size of the discharge space that is surrounded by the partition wall 135 and a portion of the tube 110, thereby reducing the time taken to uniformly diffuse the process gas supplied to the discharge space. Thus, the process gas may be decomposed by the plasma to reduce a time taken to supply the process gas to the processing space.

The injection holes 120 and the supply holes 161 may be provided to be dislocated from each other with respect to a radical direction of the tube 110. When the injection holes 120 and the supply holes 161 do not correspond to each other but are dislocated from each other as illustrated in FIG. 6, the process gas supplied through the supply holes 161 may not be directly discharged through the injection holes 120 of the tube 110 but have a margin for the decomposition by the plasma to improve the plasma decomposition efficiency. The process gas supplied through the supply holes 161 may be sufficiently decomposed by the plasma, and the high-density radicals may be supplied to the processing space.

Figure 7:
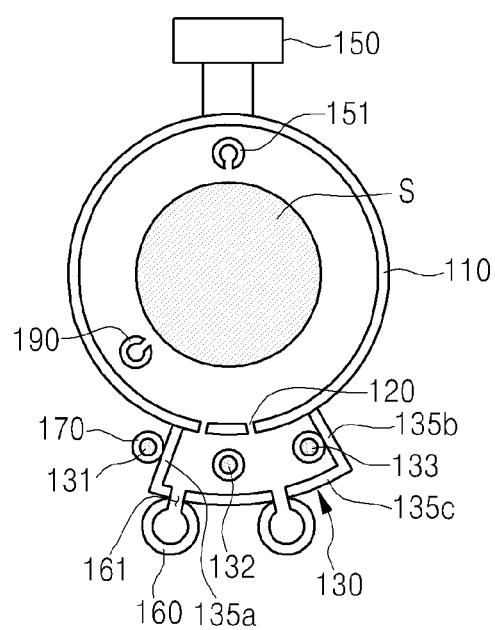
FIG. 7 is a plan view of a substrate processing apparatus in accordance with an embodiment.

FIG. 7 is a plan view of a substrate processing apparatus in accordance with an exemplary embodiment.

Referring to FIG. 7, the plasma reaction unit 130 in accordance with an exemplary embodiment may be provided outside the tube 110. A configuration and effect of the plasma reaction unit 130 are the same or similar to those described with reference to FIG. 6.

A partition wall 135 may include first and second sub sidewalls 135a and 135b, which are disposed outside the tube 110 and connected to the outer wall of the tub 110, and a main sidewall 135c disposed between the first and second sub sidewalls 135a and 135b. The partition wall 135 may include the first and second sub sidewalls 135a and 135b extending to the outside of the tube 110 from the outer wall of the tube 110 and spaced apart from each other and the main sidewall 135c disposed between the first and second sub sidewalls 135a and 135b and spaced apart from the outer wall of the tube 110.

A first electrode 131 may be disposed adjacent to an outer wall of the first sub sidewall 135a, and a third electrode 133 may be disposed adjacent to an inner wall of the second sub sidewall 135b.

The plurality of gas supply pipes 160 may be disposed outside the main sidewall 135c, i.e., outside the discharge space, i.e., disposed outward from a line connecting the first to third electrodes 131, 132, and 133 to each other, and supply holes 161 of the plurality of gas supply pipes 160 may be defined toward a space between the first electrode 131 and the second electrode 132 and a space between the second electrode 132 and the third electrode 133.

In an exemplary embodiment, since the plasma reaction unit 130 is disposed outside the tube 110, the tube 110 may limit unit processing spaces in which a plurality of substrates S are loaded. In addition, since the unit processing spaces for the substrate S, which are respectively loaded on layers, are limited by an inner wall surface of the processing space so as to be separated from each other, the radicals injected from the injection holes 120, which respectively correspond to the unit processing spaces, may be not wasted and uniformly supplied onto top surfaces of the substrates S so as to be laminar-flow.

Figure 8:
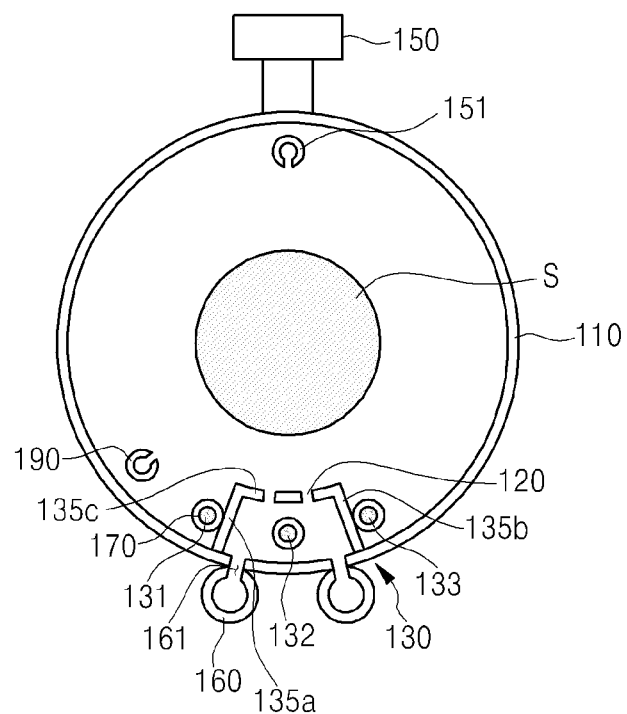
FIG. 8 is a plan view of a substrate processing apparatus in accordance with an embodiment.

FIG. 8 is a plan view of a substrate processing apparatus in accordance with an exemplary embodiment.

The substrate processing apparatus according to an embodiment of the present inventive concept is the same as or similar to the substrate processing apparatus of FIG. 6 except for a plasma reaction unit 130, and thus, following description will mainly focus on differences.

A plurality of electrodes 131, 132, and 133 include a first electrode 131, a second electrode 132, and a third electrode 133, which are spaced apart from each other in a circumferential direction and are sequentially disposed. The plurality of electrodes 131 and 132 include the first electrode 131 and the third electrode 133, which are disposed outside the partition wall 135 and a second electrode 132 disposed inside the partition wall 135. The first and third electrodes 131 and 133 may be connected to an RF power source, and the second electrode 132 may be grounded. The first electrode 131 may be disposed adjacent to an outer wall of the first sub sidewall 135a of the partition wall 135, and the second electrode 132 may be disposed adjacent to an outer wall of the second sub sidewall 135b.

In an exemplary embodiment, the first electrode 131 and the third electrode 133, to which the RF power is applied to generate the plasma in the discharge space, may be disposed outside the partition wall 135 to prevent a protective pipe 170, the first electrode 131, and the third electrode 133 from being damaged by the plasma.

In addition, the first electrode 131 and the third electrode 133 may be disposed outside the partition wall 135 to reduce a size of the discharge space that is surrounded by the partition wall 135 and a portion of the tube 110, thereby reducing the time taken to uniformly diffuse the process gas supplied to the discharge space. Thus, the process gas may be decomposed by the plasma to reduce a time taken to supply the process gas to the processing space.

Figure 9:
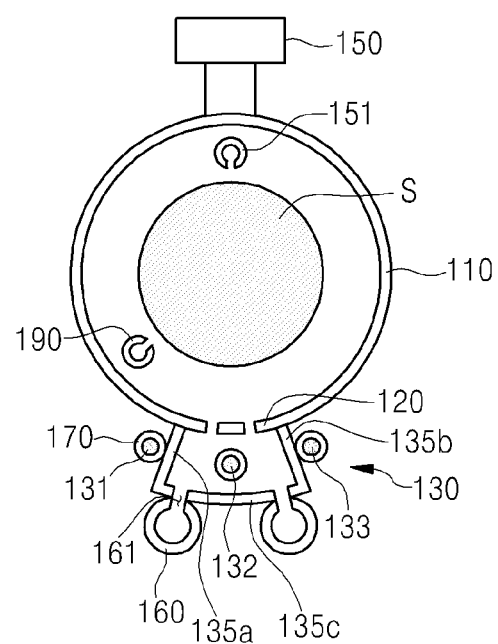
FIG. 9 is a plan view of a substrate processing apparatus in accordance with an embodiment.

FIG. 9 is a plan view of a substrate processing apparatus in accordance with an exemplary embodiment.

Referring to FIG. 9, a plasma reaction unit 130 in accordance with an exemplary embodiment may be provided outside the tube 110. A configuration and effect of the plasma reaction unit 130 are the same or similar to those described with reference to FIG. 6.

A partition wall 135 may include first and second sub sidewalls 135a and 135b, which are disposed outside the tube 110 and connected to the outer wall of the tub 110, and a main sidewall 135c disposed between the first and second sub sidewalls 135a and 135b. The partition wall 135 may include the first and second sub sidewalls 135a and 135b extending to the outside of the tube 110 from the outer wall of the tube 110 and spaced apart from each other and the main sidewall 135c disposed between the first and second sub sidewalls 135a and 135b and spaced apart from the outer wall of the tube 110.

The first electrode 131 may be disposed adjacent to an outer wall of the first sub sidewall 135a, and the third electrode 133 may be disposed adjacent to an outer wall of the second sub sidewall 135b.

The plurality of gas supply pipes 160 may be disposed outside the main sidewall 135c, i.e., disposed outward from a line connecting the first to third electrodes 131, 132, and 133 to each other, and supply holes 161 of the plurality of gas supply pipes 160 may be defined toward a space between the first electrode 131 and the second electrode 132 and a space between the second electrode 132 and the third electrode 133.

In an exemplary embodiment, since the plasma reaction unit 130 is disposed outside the tube 110, the tube 110 may limit unit processing spaces in which a plurality of substrates S are loaded. In addition, since the unit processing spaces for the substrate S, which are respectively loaded on layers, are limited by an inner wall surface of the processing space so as to be separated from each other, the radicals injected from the injection holes 120, which respectively correspond to the unit processing spaces, may be not wasted and uniformly supplied onto top surfaces of the substrates S so as to be laminar-flow.

Figure 10A:
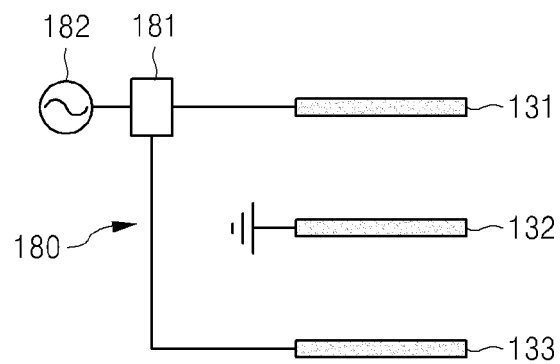
FIGS. 10A, 10B and 10C are circuit diagrams illustrate RF power supply methods in accordance with some exemplary embodiments.
Figure 10B:
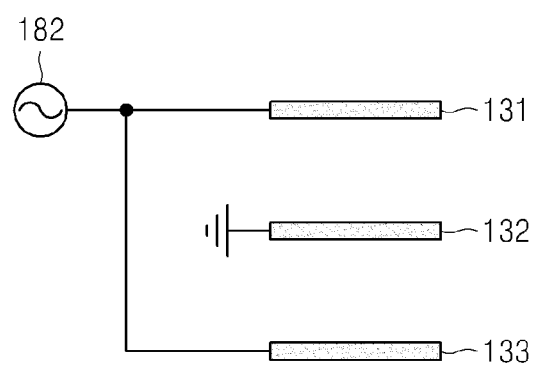
Figure 10C:
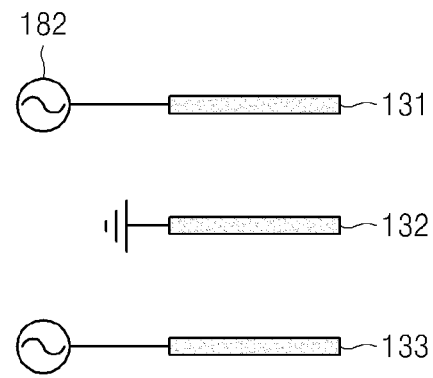

FIGS. 10A, 10B and 10C are circuit diagrams illustrating RF power supply methods in accordance with some exemplary embodiments.

Referring to FIG. 10A, a variable power supply unit 180 may include an RF power source 182 supplying RF power and RF splitters 181 which are respectively provided between the RF power source 182 and a first electrode 131 and between the RF power source 182 and a third electrode 133 to adjust an intensity and ratio of the RF power.

As illustrated in FIGS. 4 to 7, when the first electrode 131 is disposed outside the partition wall 135, and the second electrode 132 and the third electrode 133 are disposed inside the partition wall 135, non-uniform plasma, in which plasma in a space between the first electrode 131 and the second electrode 132 and plasma in a space between the second electrode 132 and the third electrode 133 have densities different from each other, may be generated. In an exemplary embodiment, the RF power applied to each of the first electrode 131 and the third electrode 133 may be adjusted in intensity and ratio by using the variable power supply unit 180 so as to generate the uniform plasma. The RF splitters 181 may adjust the intensity or ratio of the RF power supplied from the electrically connected RF power source 182 so that the RF power having different intensities are respectively applied to the first electrode 131 and the third electrode 133.

As illustrated in FIGS. 8 and 9, even when both the first electrode 131 and the third electrode 133 are disposed outside the partition wall 135, the plasma generated between the first electrode 131 and the second electrode 132 and between the second electrode 132 and the third electrode 133 may have non-uniform densities. However, in an exemplary embodiment, the RF power having the different intensities may be respectively applied to the first electrode 131 and the third electrode 133 in the variable power supply unit 180 to generate the uniform plasma in the space between the first electrode 131 and the second electrode 132 and the space between the second electrode 132 and the third electrode 133.

The variable power supply unit 180 may further include probes, which are respectively provided between the first electrode 131 and the second electrode 132 and between the second electrode 132 and the third electrode 133 to measure discharge characteristics (discharge current, discharge voltages, phases, etc.) of the plasma. Thus, the RF power may be adjusted in intensity and ratio in accordance with a difference in discharge characteristic measured from the probes.

Referring to FIGS. 10A, 10B and 10C, the first electrode 131 and the third electrode 133 may be electrically connected to two RF power sources 182 to independently receive the RF power so as to generate the uniform plasma.

On the other hand, referring to FIG. 10B, when the densities of the plasma generated between the first electrode 131 and the second electrode 132 and between the second electrode 132 and the third electrode 133 are uniform or when distances between the first to third electrodes 131, 132, 133 are adjustable, the RF power output from one RF power source 182 may be equally distributed to be supplied to the first electrode 131 and the third electrode 133.

Also, the RF power source 182 may supply pulsed RF power to the first electrode 131 and the third electrode 133. The pulsed RF power may be adjusted in pulse width and duty ratio in a pulse frequency range of approximately 1 kHz to approximately 10 kHz.

In accordance with the exemplary embodiment, the process gas supplied from the gas supply pipe may be decomposed in the separate discharge space that is separated from the processing space so as to be provided into the processing space, thereby preventing particles from being separated from the inner wall of the tube.

In accordance with the exemplary embodiment, the electrode to which the RF power is applied to generate the plasma may be disposed outside the partition wall providing the discharge space to prevent the electrode and the protective pipe from being damaged by the plasma.

In accordance with the exemplary embodiment, since the gas supply pipe is disposed outside the partition wall to directly supply the process gas into the discharge space inside the partition wall, the eddy may not occur inside the partition wall, and also, the discharge space may be reduced in volume to generate the uniform pressure in the discharge space within the short time.

In accordance with the exemplary embodiment, the pulsed RF power may be supplied to the electrode to reduce the density of the ions during the processing while constantly maintaining the density of the radicals. In accordance with the exemplary embodiment, the partition wall may be prevented from being damaged by the plasma while maintaining the efficiency of the processing process.

In accordance with the exemplary embodiment, the variable power supply may be used to adjust the intensity and ratio of the RF power applied to each of the plurality of electrodes, thereby generating the uniform plasma.

As described above, while this invention has been particularly shown and described with reference to preferred embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present inventive concept.

What is claimed is:

1. A batch type substrate processing apparatus comprising:
   a tube configured to provide a processing space in which a plurality of substrates are accommodated;
   a partition wall which is separated from the processing space, provides a discharge space in which plasma is generated, and extends in a longitudinal direction of the tube;
   a gas supply pipe configured to supply a process gas required for processing the plurality of substrates to the discharge space; and
   a plurality of electrodes extending in the longitudinal direction of the tube and configured to generate plasma in the discharge space,
   wherein at least one of the plurality of electrodes is disposed outside the partition wall, and at least one of the plurality of electrodes is disposed inside the partition wall.

2. The batch type substrate processing apparatus of claim 1, wherein the plurality of electrodes comprise:
   a first electrode disposed outside the partition wall; and
   a second electrode disposed inside the partition wall,
   wherein the first electrode is connected to an RF power source, and the second electrode is grounded.

3. The batch type substrate processing apparatus of claim 2, wherein the first electrode, the second electrode, and the gas supply pipe are spaced apart from each other in a circumferential direction of the tube, and the gas supply pipe is disposed outside the partition wall.

4. The batch type substrate processing apparatus of claim 2, wherein the RF power source supplies pulsed RF power having a pulse frequency of approximately 1 kHz to approximately 10 kHz to periodically turn on/off the plasma.

5. The batch type substrate processing apparatus of claim 1, wherein the plurality of electrodes comprise a first electrode, a second electrode, and a third electrode, which are spaced apart from each other in a circumferential direction of the tube and sequentially disposed, the first electrode is disposed outside one side of the partition wall, and the second electrode and the third electrode are disposed inside the partition wall, and the first electrode and the third electrode are connected to an RF power source, and the second electrode is grounded.

6. The batch type substrate processing apparatus of claim 5, wherein a distance between the first electrode and the second electrode in the circumferential direction of the tube is greater than that between the second electrode and the third electrode in the circumferential direction of the tube.

7. The batch type substrate processing apparatus of claim 5, wherein the gas supply pipe is disposed outside another side of the partition wall in the circumferential direction of the tube.

8. The batch type substrate processing apparatus of claim 5, wherein the gas supply pipe comprises a plurality of gas supply pipes disposed outside the discharge space to supply the process gas to a space between the first electrode and the second electrode and a space between the second electrode and the third electrode.

9. The batch type substrate processing apparatus of claim 5, further comprising a variable power supply unit configured to respectively supply RF power having different intensities to the first electrode and the third electrode.

10. The batch type substrate processing apparatus of claim 5, wherein the RF power source supplies pulsed RF power having a pulse frequency of approximately 1 kHz to approximately 10 kHz to periodically turn on/off the plasma.

11. The batch type substrate processing apparatus of claim 1, wherein the plurality of electrodes comprise a first electrode, a second electrode, and a third electrode, which are spaced apart from each other in a circumferential direction of the tube and sequentially disposed, and the first electrode and the third electrode are disposed outside the partition wall and connected to an RF power source, and the second electrode is disposed inside the partition wall and grounded.

12. The batch type substrate processing apparatus of claim 11, wherein a distance between the first electrode and the second electrode in the circumferential direction of the tube is equal to that between the second electrode and the third electrode in the circumferential direction of the tube.

13. The batch type substrate processing apparatus of claim 11, wherein the gas supply pipe comprises a plurality of gas supply pipes disposed outside the discharge space to supply the process gas to a space between the first electrode and the second electrode and a space between the second electrode and the third electrode.

14. The batch type substrate processing apparatus of claim 11, further comprising a variable power supply unit configured to respectively supply RF power having different intensities to the first electrode and the third electrode.

15. The batch type substrate processing apparatus of claim 11, wherein the RF power source supplies pulsed RF power having a pulse frequency of approximately 1 kHz to approximately 10 kHz to periodically turn on/off the plasma.

16. The batch type substrate processing apparatus of claim 1, wherein the partition wall is disposed inside or outside the tube.

* * * * *